(12) United States Patent
Polishchuk et al.

(10) Patent No.: US 8,592,891 B1
(45) Date of Patent: Nov. 26, 2013

(54) METHODS FOR FABRICATING SEMICONDUCTOR MEMORY WITH PROCESS INDUCED STRAIN

(75) Inventors: Igor Polishchuk, Fremont, CA (US);
Sagy Levy, Zichron-Yoakev (IL);
Krishnaswamy Ramkumar, San Jose, CA (US); Jeong Byun, Cupertino, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 13/539,463

(22) Filed: Jul. 1, 2012

Related U.S. Application Data

(60) Continuation-in-part of application No. 13/168,711, filed on Jun. 24, 2011, which is a division of application No. 12/152,521, filed on May 13, 2008, now abandoned.

(60) Provisional application No. 60/940,156, filed on May 25, 2007.

(51) Int. Cl.
*H01L 29/76* (2006.01)

(52) U.S. Cl.
USPC ............. 257/324; 438/287; 257/E29.309

(58) Field of Classification Search
USPC ............. 257/314, 324, E29.309, E21.21, 257/E21.423, E21.679; 438/287
See application file for complete search history.

(56) References Cited

U.S. PATENT DOCUMENTS

| | | | |
|---|---|---|---|
| 6,908,822 B2 | 6/2005 | Rendon et al. | |
| 6,992,025 B2 | 1/2006 | Maa et al. | |
| 7,026,235 B1 | 4/2006 | Ben-Tzur et al. | |
| 7,033,869 B1 | 4/2006 | Xiang et al. | |
| 7,521,314 B2 | 4/2009 | Jawarani et al. | |
| 7,659,213 B2 | 2/2010 | Wei et al. | |
| 7,678,662 B2 * | 3/2010 | Arghavani et al. | 438/424 |

OTHER PUBLICATIONS

USPTO Advisory Action for U.S. Appl. No. 12/152,521 dated May 2, 2011; 2 pages.
USPTO Final Rejection for U.S. Appl. No. 12/152,521 dated Feb. 24, 2011; 9 pages.
USPTO Non Final Rejection for U.S. Appl. No. 13/168,711 dated May 9, 2013; 7 pages.
USPTO Non-Final Rejection for U.S. Appl. No. 12/152,521 dated Sep. 28, 2010; 7 pages.
USPTO Requirement for Restriction for U.S. Appl. No. 12/152,521 dated Aug. 13, 2010; 5 pages.

* cited by examiner

*Primary Examiner* — Quoc Hoang

(57) ABSTRACT

A semiconductor device and method of fabricating the same are provided. In one embodiment, the semiconductor device includes a memory transistor with an oxide-nitride-nitride-oxide (ONNO) stack disposed above a channel region. The ONNO stack comprises a tunnel dielectric layer disposed above the channel region, a multi-layer charge-trapping region disposed above the tunnel dielectric layer, and a blocking dielectric layer disposed above the multi-layer charge-trapping region. The multi-layer charge-trapping region includes a substantially trap-free layer comprising an oxygen-rich nitride and a trap-dense layer disposed above the trap-free layer. The semiconductor device further includes a strain inducing structure including a strain inducing layer disposed proximal to the ONNO stack to increase charge retention of the multi-layer charge-trapping region. Other embodiments are also disclosed.

20 Claims, 11 Drawing Sheets

METHODS FOR FABRICATING SEMICONDUCTOR MEMORY WITH PROCESS INDUCED STRAIN

CROSS-REFERENCE TO RELATED APPLICATIONS

This application is a continuation-in-part of co-pending U.S. application Ser. No. 13/168,711, filed Jun. 24, 2011, which is a divisional of U.S. application Ser. No. 12/152,521, filed May 13, 2008, now abandoned, which claims the benefit of priority under 35 U.S.C. 119(e) to U.S. Provisional Patent Application Ser. No. 60/940,156 filed May 25, 2007, all of which application are hereby incorporated by reference in their entirety.

TECHNICAL FIELD

The present invention relates generally to semiconductor devices, and more particularly to non-volatile semiconductor memories and methods of fabricating the same.

BACKGROUND

Non-volatile semiconductor memories are devices that can be electrically erased and reprogrammed. One type of non-volatile memory that is widely used for general storage and transfer of data in and between computers and other electronic devices is flash memory, such as a split gate flash memory. A split gate flash memory transistor has an architecture similar to that of a conventional logic transistor, such as Metal-Oxide-Semiconductor Field Effect Transistor (MOSFET), in that it also includes a control gate formed over a channel connecting a source and drain in a substrate. However, the memory transistor further includes a charge trapping layer between the control gate and the channel and insulated from both by insulating or dielectric layers. A programming voltage applied to the control gate traps a charge on the charge trapping layer, partially canceling or screening an electric field from the control gate, thereby changing a threshold voltage ($V_T$) of the transistor and programming the memory cell. During read-out, this shift in $V_T$ is sensed by the presence or absence of current flow through the channel with application of a predetermined read-out voltage. To erase the memory transistor, an erase voltage is applied to the control gate to restore, or reverse the shift in $V_T$.

An important measure of merit for flash memories is data retention time, which is the time for which the memory transistor can hold charge or remain programmed without the application of power. The charge stored or trapped in the charge trapping layer decreases over time due to leakage current through the insulating layers, thereby reducing the difference between a programmed threshold voltage (VTP) and an erased threshold voltage (VTE) limiting data retention of the memory transistor. Up until this time, efforts to improve data retention have focused on engineering of band-gaps of materials of the charge storage and insulating layers to increase charge trapping and/or reduce leakage current. However there are several fundamental problems with this approach.

One problem is that as semiconductor memories and their associated memory transistors continue to scale to smaller geometries it becomes increasingly difficult to control composition and thickness of the charge storage and insulating layers to achieve desired data retention time.

Another problem is that increasingly semiconductor memories combine logic transistors, such as MOSFET's, with memory transistors in integrated circuits (ICs) fabricated on a common substrate for embedded memory or System-On-Chip (SOC) applications. Many of the current processes for improving performance of memory transistors through band-gap engineering are incompatible with those used for fabricating logic transistors.

Finally, the current band-gap engineering processes do nothing to improve the speed or efficiency, measured as a function of the programming voltage or power applied to the control gate, with which the memory transistors are programmed.

Accordingly, there is a need for memory transistors and methods of forming the same that provides improved data retention, and increased programming speed and efficiency. It is further desirable that the methods of forming the memory device are compatible with those for forming logic elements in the same IC formed on a common substrate.

SUMMARY OF THE INVENTION

The present invention provides a solution to these and other problems, and offers further advantages over conventional memory cells or devices and methods of forming the same.

In one embodiment, the semiconductor device includes a memory transistor with an oxide-nitride-nitride-oxide (ONNO) stack disposed above a channel region. The ONNO stack comprises a tunnel dielectric layer disposed above the channel region, a multi-layer charge-trapping region disposed above the tunnel dielectric layer, and a blocking dielectric layer disposed above the multi-layer charge-trapping region. The multi-layer charge-trapping region includes a substantially trap-free layer comprising an oxygen-rich nitride and a trap-dense layer disposed above the trap-free layer. The semiconductor device further includes a strain inducing structure including a strain inducing layer disposed proximal to the ONNO stack to increase charge retention of the multi-layer charge-trapping region.

In another embodiment, the method includes: (i) forming an oxide-nitride-nitride-oxide (ONNO) stack for a memory transistor on a surface of a substrate overlying a channel region formed therein, the ONNO stack including a tunnel dielectric layer disposed above the channel region, a multi-layer charge-trapping region disposed above the tunnel dielectric layer, the multi-layer charge-trapping region including a substantially trap-free layer comprising an oxygen-rich nitride and a trap-dense layer disposed above the trap-free layer, and a blocking dielectric layer disposed above the multi-layer charge-trapping region; and (ii) forming a strain inducing structure including a strain inducing layer disposed over the ONNO stack to increase charge retention of the multi-layer charge-trapping region.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

The present invention is directed generally to non-volatile semiconductor memories including a silicon-oxide-nitride-oxide-silicon (SONOS) memory transistor or cell and incorporating a strain inducing structure to increase data retention and/or to improve programming time and efficiency. The structure and method are particularly useful for embedded memory or System-On-Chip (SOC) applications in which a semiconductor memory includes both memory and logic transistors in an integrated circuit (IC) formed on a common substrate.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly connect and to indirectly connect through one or more intervening components.

In a first embodiment the method includes steps of forming a strain inducing structure in or on a surface of a substrate proximal to, and preferably surrounding, a region of the substrate in which a channel of a non-volatile memory transistor is to be formed prior to forming the transistor. Inducing strain in the channel of the memory transistor will reduce the band gap, and, depending on the type of strain, increases carrier mobility. For example, tensile strain, in which inter-atomic distances in the crystal lattice of the substrate are stretched, increases the mobility of electrons, making N-type transistors faster. Compressive strain, in which those distances are shortened, produces a similar effect in P-type transistors by increasing the mobility of holes. Both of these strain induced factors, i.e., reduced band gap and increased carrier mobility, will result in more efficient generation of hot carriers, which in turn, results in faster and more efficient programming of the memory transistor.

Figure 1:
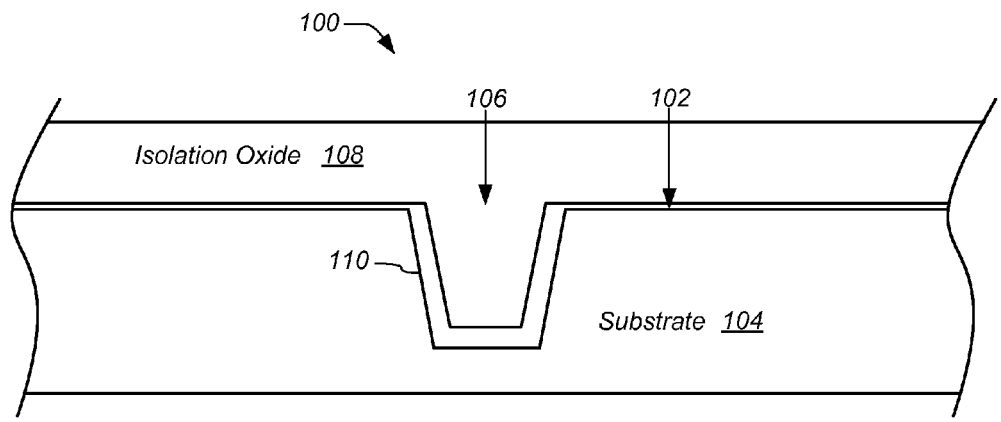
FIG. 1 is a block diagram illustrating a cross-sectional side view of a portion of a substrate of a semiconductor memory including a strain inducing isolation structure according to an embodiment of the present invention.

In one version of this embodiment the strain inducing structure includes one or more shallow trench isolation (STI) structures filled with a dielectric material, such as an isolation oxide, having a high intrinsic tensile stress, and disposed about or encompassing the region in which the memory transistor is to be formed. FIG. 1 depicts a partial cross-sectional view of a strain inducing STI structure 100 formed in a surface 102 of a semiconductor wafer or substrate 104 near to a region or regions in which memory transistor(s) (not shown in this figure) will be formed. The STI structure 100 includes one or more relatively deep STI trenches 106 etched or formed in the substrate 104, and filled with an isolation oxide 108 having a high intrinsic tensile stress. The STI structure 100 further includes a liner oxide 110 formed on the surface 102 of the substrate 104 and on interior surfaces of the STI trench 106 prior to filling with the isolation oxide 108.

The substrate 104 may include any known semiconductor material, such as Silicon, Gallium-arsenide, Germanium, Gallium-nitride, Aluminum-phosphide, and mixtures or alloys thereof. Preferably, the substrate 104 is a doped or undoped silicon-based semiconductor substrate, such as a monocrystalline silicon, silicon-germanium, silicon-on-insulator, or silicon-on-sapphire substrate.

The liner oxide 110 can include a thin layer or film of a thermally grown silicon-dioxide (SiO2) having a thickness of from about 10 to about 200 angstroms (Å), and more preferably at least about 125 Å.

The STI trench 106 generally has a depth of from about 2000 to about 4000 Å, and a width or cross-section of from about 40 to about 250 nm.

Referring to FIG. 1, the method of forming the strain inducing STI structure 100 begins with forming a patterned mask layer over the surface 102 of the substrate 104 and etching a number of STI trenches 106 into the substrate 102. Preferably, the number of STI trenches 106 includes trenches etched on each side of the region in which the memory transistor is to be formed, or a single STI trench substantially encompassing the region to induce biaxial or uniaxial strain in the region. The patterned mask layer (not shown) can be formed, for example, by depositing and patterning a plasma enhanced chemical vapor deposition (PECVD) nitride layer using standard photolithographic techniques and nitride etch technologies. The STI trench etch can be accomplished using any suitable dry etching chemistry for etching a semiconductor or silicon substrate. Suitable STI trench etch chemistries can include, for example, one or more of the following etchant or process gases trichloroborane ($BCl_3$), Chlorine ($Cl_2$), oxygen ($O_2$) and hydrogen-bromide (HBr). In addition, the etch chemistry may further include an inert gas, such as argon (Ar), nitrogen ($N_2$), or xenon (Xe).

The STI etch is followed by the forming of the liner oxide 110 on surfaces of the substrate 104 exposed by the STI trench 106. The liner oxide 110 can be formed in a number of ways including, for example, thermally growing the oxide in the same or a separate process chamber of a process tool, such as a thermal reactor or furnace.

Next, the patterned mask layer is removed and the STI trenches 106 filled with an isolation oxide 108 having a high intrinsic tensile stress to yield the intermediate structure shown in FIG. 1. Excess isolation oxide 108 can be removed using, for example, a chemical mechanical polishing or planarizing (CMP) process. Preferably, substantially all of the isolation oxide 108 on top of the surface 102 of the substrate 104 is removed.

Generally, the isolation oxide 108 can be deposited or grown using any suitable process and material having or providing a high intrinsic tensile stress. Preferably, the isolation oxide 108 is a tensile High Aspect Ratio Process (HARP™) oxide commercially available from Applied Materials, Inc. of Santa Clara, Calif., and deposited using a HARP™ oxidation process. The HARP™ oxide can be deposited, for example, in a low pressure chemical vapor deposition (LPCVD) tool using ozone ($O_3$) and/or tetraethylorthosilicate (TEOS) based process gas or precursors.

Unlike the band-gap engineering approaches used previously to improve memory transistor performance, the methods of forming the strain inducing structures of the present invention are compatible with standard semiconductor fabrication processes used to form logic elements or transistors, such as Metal-Oxide-Semiconductor Field Effect Transistors (MOSFETs). Thus, advantageously the semiconductor memory further includes a number of logic transistors (not shown) formed on the same substrate, and the STI structure further comprises a number of trenches filled with high intrinsic tensile stress isolation oxide proximal to, and preferably surrounding, the region in which the logic transistors are to be formed to induce strain in a channel of the logic transistor to improve logic transistor performance through reduced band gap and increased carrier mobility.

In other embodiments, the strain inducing structure can alternatively or additionally comprise an overlying strain inducing layer or structure formed over the completed transistors. Several of these embodiments will now be described in greater detail with reference to FIGS. 2A through 2E, which schematically illustrate cross-sectional side views of a non-volatile memory transistor and the overlying strain inducing structure according to various embodiments of the present invention. For purposes of clarity, many of the details of semiconductor fabrication that are widely known and are not relevant to the present invention have been omitted from the following description.

Figure 2A:
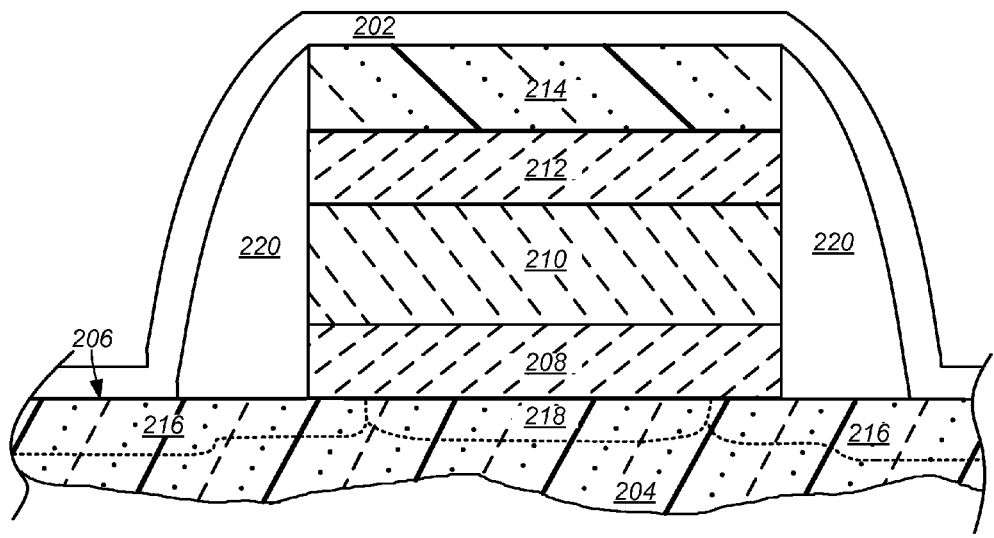
FIG. 2A is a partial cross-sectional side view of a memory transistor and a strain inducing layer according to an embodiment of the present invention.

In a first of these alternative embodiments, shown in FIG. 2A, the strain inducing structure comprises a strain inducing layer 202 overlying the completed transistor previously formed on a substrate 204. In the embodiment shown in FIG. 2A the transistor is a SONOS memory transistor comprising a SONOS gate stack formed over a surface 206 of the substrate 202. The SONOS gate stack generally includes a lower oxide layer 208, a nitride or oxynitride charge storing or trapping layer 210, a top oxide layer 212, and a gate electrode 214, typically poly-silicon (poly), formed over the charge storing layer. The transistor further includes heavily doped source and drain (S/D) regions 216 aligned to the gate stack and separated by an undoped or lightly doped channel region or channel 218. Generally, one or more sidewall spacers 220 surround the gate stack to electrically insulate it from contacts (not shown) to the S/D regions 216 and from other transistors or devices in the IC formed on the substrate 204.

It will be appreciated that the strain inducing layer 202, which substantially covers the completed transistor, induces strain in the gate stack as well as in the underlying channel 218. As noted above, inducing strain in the channel 218 improves transistor performance by reducing the band gap and increasing carrier mobility. In addition, it has been found inducing strain in the SONOS gate stack will change energy levels of charge traps formed within the charge trapping layer 210 improving data retention characteristics of the memory transistor, as shown in the of FIG. 3.

Figure 3:
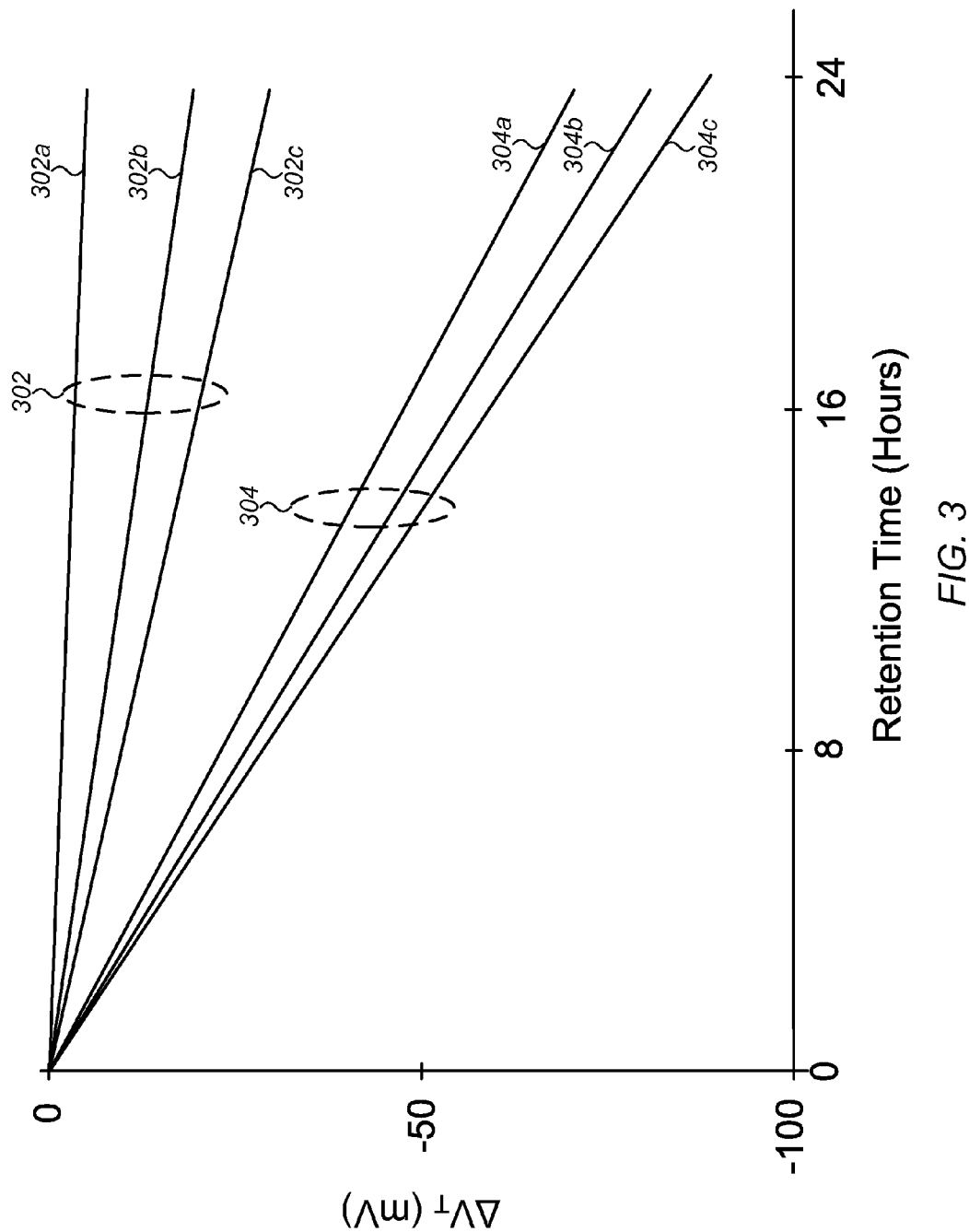
FIG. 3 is a graph showing an improvement in data retention for a SONOS memory transistor in which strain is induced in a gate stack as well as in an underlying channel as compared to a conventional memory cell.

FIG. 3 is a graph showing an improvement in data retention for a SONOS memory transistor in which strain is induced in a gate stack as well as in an underlying channel as compared to a conventional memory cell. The group of traces or lines labeled 302 illustrates non-volatile memory (NVM) cell data retention for NVM cells held at 190° C. for 24 hours and comprising memory transistors with an induced tensile strain of about 162 MPa according to the present invention. The group of traces or lines labeled 304 illustrates data retention for conventional NVM cells under the same conditions. In particular, the line labeled 302a illustrates data retention for a NVM cell transistor with an induced tensile strain having a width-to-length ratio (W/L) ratio of 0.16μ/0.26μ; the line labeled 302b illustrates data retention for a NVM cell having a W/L ratio of 0.16μ/0.24μ; and the line labeled 302c illustrates data retention for a NVM cell having a W/L ratio of 0.16μ/0.22μ. Similarly, the line labeled 304a illustrates data retention for a conventional NVM cell having a W/L ratio of 0.16μ/0.26μ; the line labeled 304b illustrates data retention for a NVM cell having a W/L ratio of 0.16μ/0.24μ; and the line labeled 304c illustrates data retention for a NVM cell having a W/L ratio of 0.16μ/0.22μ. Referring to FIG. 3, it is seen that after 24 hours a programmed threshold voltage (Vt) for the unstained memory transistors of a conventional NVM (represented by the group of traces or lines labeled 304) cell has decreased by more than about 50 millivolts (mV). However, in the same time period the programmed Vt for the memory transistors comprising induced tensile strain of according to the present invention (represented by the group of traces or lines labeled 302) cell has decreased by less than about 25 mV, indicating at least an order of magnitude improvement in retention time.

The strain inducing layer 202 can include one or more layers of a suitable material including, for example, one or more layers of silicon-oxides, silicon-nitrides, and/or silicon-germanium, having thicknesses and deposited under conditions selected to induce a desired compressive or tensile strain in the channel 218 and/or the gate stack.

Preferably, the strain inducing layer 202 includes a silicon-nitride (nitride) layer deposited to a thickness of from about 100 angstroms (Å) to about 1000 Å, and more preferably from about 300 Å to about 500 Å. For example, in one embodiment the strain inducing layer 202 can include a Plasma Enhanced Chemical Vapor Deposition (PECVD) silicon-nitride ($Si_3N_4$) layer deposited by a PCEVD process using a silicon source, such as silane, chlorosilane, or dichlorosilane, and a nitrogen source, such as nitrogen ($N_2$) or ammonia ($NH_3$). Suitable PECVD tools include, for example, a Novellus PECVD tool, commercially available from Novellus Systems, Inc. of San Jose, Calif.

Alternatively, the strain inducing layer 202 can include a Bis-TertiaryButylAmino Silane (BTBAS) silicon-nitride layer (Si3N4) that is deposited using a BTBAS gas or precursor in a Low Pressure Chemical Vapor Deposition (LPCVD) or Atomic Layer Deposition (ALD) process to produce a longitudinal tensile strain and a vertically compressive strain in the channel region 218, both of which increase electron mobility in a NFET or N-type device.

Figure 2B:
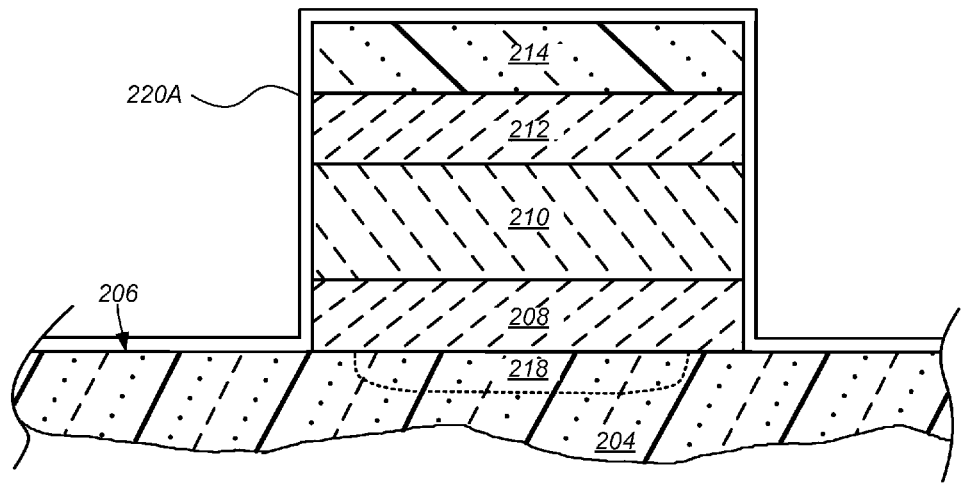
FIGS. 2B through 2D illustrate a process flow for forming a memory transistor a comprising composite spacers including a disposable material that is removed prior to forming the strain inducing layer according to an embodiment of the present invention.
Figure 2C:
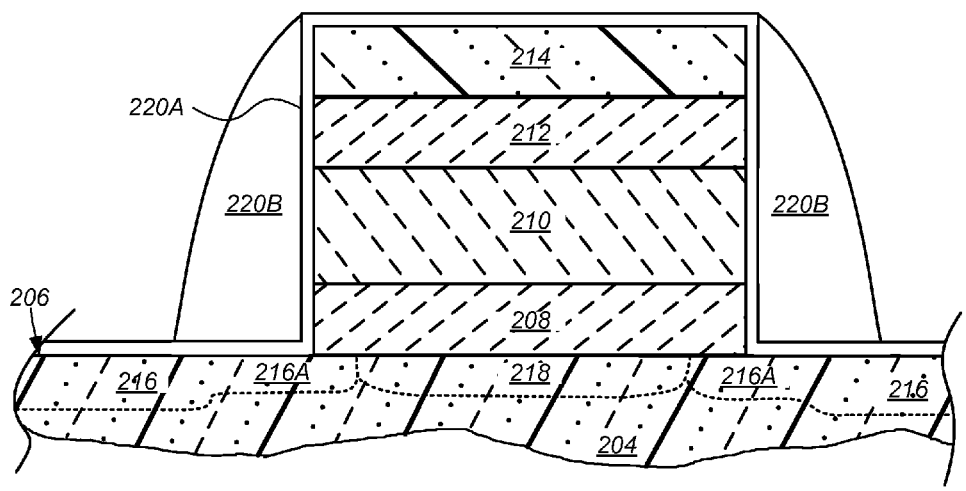
Figure 2D:
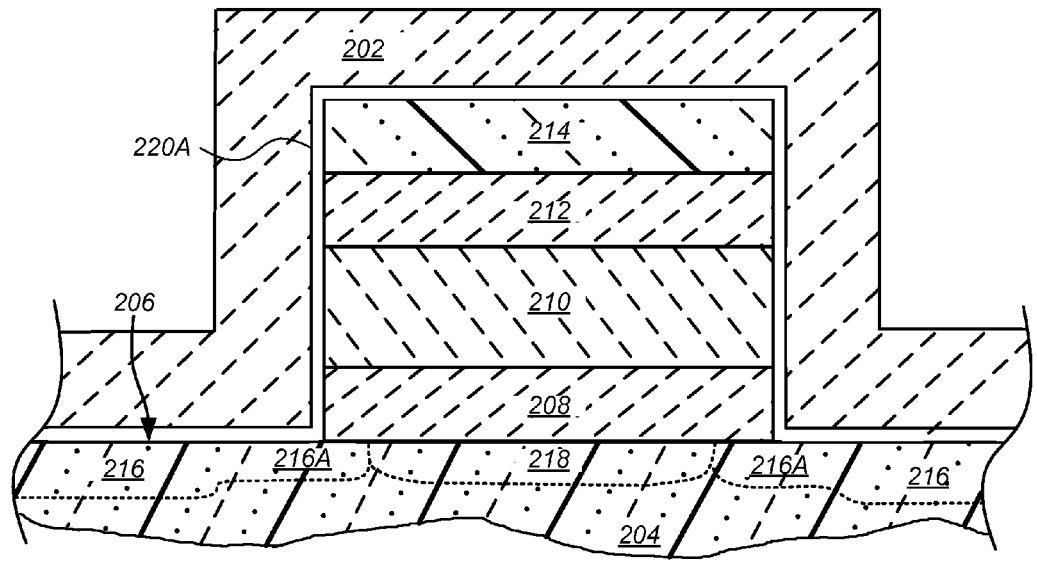

In another embodiment, illustrated in FIGS. 2B through 2D, the sidewall spacers for the memory transistor and/or the logic transistors can include composite spacers comprising a protective liner 220A and a sacrificial or disposable material 220B that is removed prior to forming the strain inducing layer 202. It will be appreciated that by eliminating the permanent sidewall spacers found in conventional transistors, the pitch or spacing between transistors or devices in the semiconductor memory or IC can be reduced. Moreover, eliminating the permanent spacers allows the strain inducing layer 202 to be located closer to the channel 218 and the SONOS gate stack, thereby enabling it to produce a more focused strain of from about to about 200 MPa to about 600 MPa, or from about 0.15 to about 0.30% directly in the channel and the gate stack. It has been found that this amount of strain is sufficient to yield from about a 5 to about a 20 percent increase in speed of the device.

A method of forming then removing the disposable material 220B of the composite spacers will now be described in greater detail with reference to FIGS. 2B through 2D. Referring to FIG. 2B, a protective liner 220A is formed over the gate stack and, preferably, over at least a portion of the surface 206 of the substrate 204 prior to implanting the S/D regions (not shown in this figure). The protective liner 220A serves to protect the gate stack and the adjacent surface 206 of the substrate 204 during subsequent forming and removal of the disposable spacers (not shown in this figure) and to electrically insulate it from contacts (not shown) to the S/D regions (not shown in this figure) and from other transistors or devices in the IC formed on the substrate 204. Generally, the protective liner 220A can include an oxide, such as silicon-oxide, or a nitride, such as silicon-nitride, and can be deposited by any suitable standard processing technique including, for example, Chemical Vapor Deposition (CVD), or PECVD. Preferably, the protective liner 220A extends over regions in which the source and drain of the device are to be formed.

Optionally, tip and halo implants may be performed through the protective liner 220A to form S/D extensions 216A (shown in FIG. 2C) extending partially into the channel 218 under the gate stack.

Referring to FIG. 2C, sacrificial spacers of a disposable material 220B are formed over the protective liner 220A and abutting sidewalls of the gate stack. The disposable material 220B can be formed by first depositing and then blanket etching a silicon-containing layer over the gate stack. The silicon-containing layer can include, for example, an amorphous-silicon or poly-silicon layer, or a silicon-germanium (SiGe) layer. The spacer or blanket etch may be accomplished in a number of different ways including, for example, low pressure etching at a moderate power (about 500 W) in a plasma of a chlorine containing gas, such as Cl2, or BCl3.

Next, still referring to FIG. 2C, the source and drain implants of the appropriate species and energy are implanted through the protective liner 220A and the disposable material 220B to form the S/D regions 216. Preferably, the substrate 204 is annealed to drive-in the source and drain implants creating the S/D regions 216 shown in FIG. 2C. More preferably, the anneal step, if not done immediately following the S/D implant, is at least performed prior to deposition of the strain inducing layer (described below) to avoid relaxing or reducing the strain induced by the strain inducing layer.

In FIG. 2D, the disposable material 220B is stripped or removed the strain inducing layer 202 deposited. In one embodiment, amorphous-silicon or poly-silicon disposable material 220B is removed in a dry etch step using Xenon difluoride (XeF2), preceded by a hydrofluoric (HF) dip to remove any native oxide thereon, which would otherwise impede removal of the spacers by the XeF2. A suitable XeF2 etch process involves sublimating the XeF2 is in a container or vessel to a pressure of about 4 mTorr (the vapor pressure of XeF2), and then introduced into a separate etch chamber in which the substrate 204 is positioned. Preferably, the XeF2 release or etching process is performed in vapor phase at a pressure of 60 mTorr, at room temperature and with no external energy sources. Under these conditions, a highly selective and isotropic etch of the silicon-containing layer has been observed with rates as high as 10 microns per minute. The XeF2 release process is allowed to proceed without etching any of the underlying protective liner 220A.

In an alternative embodiment, the disposable material 220B is removed in a wet etch step. For example, disposable material 220B including an amorphous or poly-silicon silicon-containing layer can be stripped or removed in a single wafer wet processing tool, commercially available from SEZ Group, of Villach, Austria, or in a wet processing bath or sink using a mixed nitric acid (HNO3) and HF wet chemistry. Disposable material 220B including a SiGe silicon-containing layer can be removed in a wet chemistry containing heated hydrogen peroxide (H2O2).

Still referring to FIG. 2D, the strain inducing layer 202 is deposited directly over the gate stack and at least a portion of the surface 206 of the substrate 204 adjacent thereto to induce strain in the channel 218 underlying the gate stack. As described above, the strain inducing layer 202 can include one or more layers of suitable material having thicknesses and deposited under conditions selected to induce a desired compressive or tensile strain in the channel 218 and/or the gate stack. Preferably, the strain inducing layer 202 includes a compressive or tensile PECVD or BTBAS silicon-nitride layer.

Figure 2E:
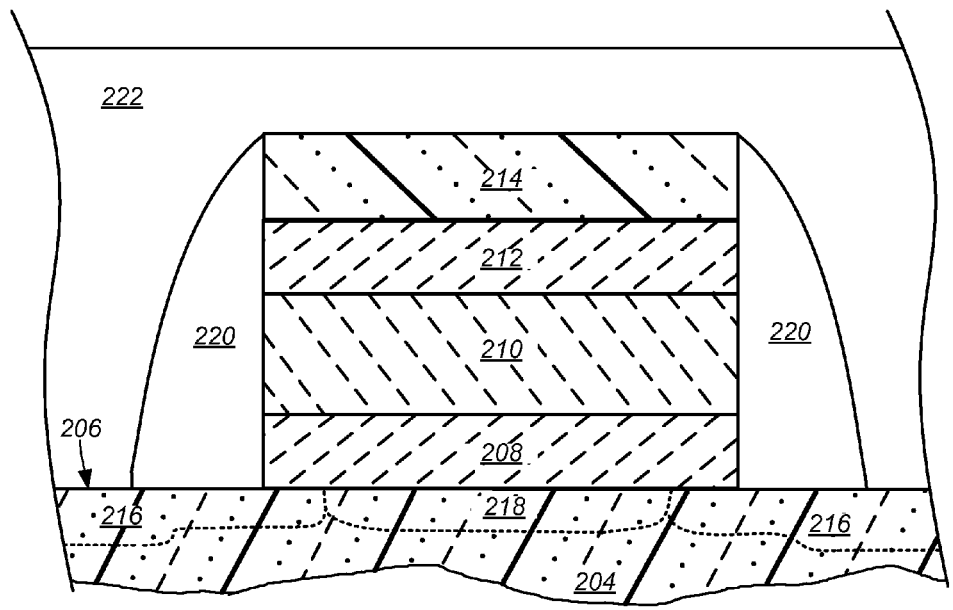
FIG. 2E is a partial cross-sectional side view of a memory transistor and a strain inducing pre-metal dielectric (PMD) layer according to an embodiment of the present invention.

In another embodiment, illustrated in FIG. 2E the strain inducing structure comprises a strain inducing pre-metal dielectric (PMD) layer 220 overlying the completed transistor previously formed on a substrate 204. As with the embodiments described above, the strain inducing PMD layer 220 can include one or more layers of a suitable dielectric material having thicknesses and deposited under conditions selected to induce a desired compressive or tensile strain in the channel 218 and/or the gate stack. Suitable dielectric materials include, for example, silicon-oxides and silicon-nitrides.

In one preferred embodiment, the strain inducing PMD layer 220 can include one or more layers of a tensile HARP™ oxide deposited in a HARP™ oxidation process using a LPCVD tool, ozone and/or TEOS based process gas or precursors. More preferably, the strain inducing PMD layer 220 has an overall or combined thickness of from about 500 Å to about 2000 Å. Generally, the surface of the PMD layer 220 is planararized using, for example, a CMP process prior to the formation of contacts (not shown) to the gate electrode 214 and S/D regions 216 of the transistor and the subsequent deposition of a local interconnect (LI) metal layer (not shown).

It will be appreciated that although the strain inducing structures of the present invention are shown in FIGS. 2A through 2E and described above as being used with SONOS memory transistors, the method and structures of the invention are not so limited and can be used with other types of FET memory or logic transistors. It is noted that a significant advantage of the present invention is that the processing method and strain inducing structures can be used to fabricate ICs including both memory and logic transistors on a single substrate, thereby improving the performance of both types of transistors. The method and structure of the present invention are particularly useful fabricating ICs including embedded memory such as System-On-Chip (SOC) ICs.

It will further be appreciated that one or more of the above described methods and structures can be combined to increase or tailor the strain induced in the channel and/or gate stack of the transistors. For example, the strain inducing STI structure 100 of FIG. 1 can be combined with any of the strain inducing structures described with respect to FIGS. 2A through 2E to increase or reduce the strain induced in the transistor channel. In addition, it will be understood that the strain inducing PMD layer 220 of FIG. 2E may be combined with the composite spacers and disposable material 220B of FIGS. 2B through 2D to decrease the pitch or spacing between transistors and focus the strain more directly in the channel and/or gate stack.

Implementations and Alternatives

In one aspect the present disclosure is directed to semiconductor devices, such as non-volatile memory transistors, including a gate stack with a multi-layer charge-trapping region disposed above a channel region, and a strain inducing structure, such as a strain inducing layer disposed proximal to the gate stack to increase charge retention of the multi-layer charge-trapping region.

In one aspect the present disclosure is directed to semiconductor devices, such as non-volatile memory transistors, including a gate stack with a multi-layer charge-trapping region disposed above a channel region, and a strain inducing structure, such as a strain inducing layer disposed proximal to the gate stack to increase charge retention of the multi-layer charge-trapping region.

Figure 4A:
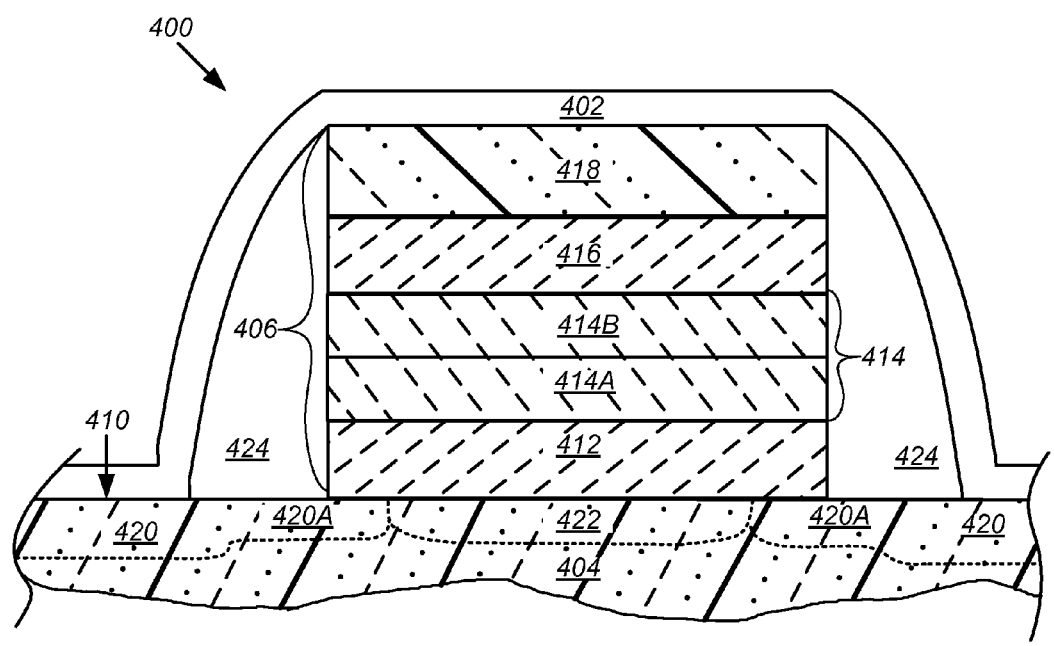
FIG. 4A is a partial cross-sectional side view of a memory transistor including a gate stack with a multi-layer charge-trapping region and a strain inducing structure according to an embodiment of the present invention.

FIG. 4A is a block diagram illustrating a cross-sectional side view of one such embodiment of a memory transistor 400. Referring to FIG. 4A, the strain inducing structure includes a strain inducing layer 402 overlying the substantially completed transistor 400 previously formed on a substrate 404. In the embodiment shown in FIG. 4A the transistor is a non-volatile memory transistor including a gate stack 406 formed over a surface 410 of the substrate 404. The gate stack 406 generally includes a tunnel dielectric layer 412 disposed above the surface 410, a multi-layer charge-trapping region 414, disposed above the tunnel dielectric layer, a blocking dielectric layer 416 disposed above the multi-layer charge-trapping region, and a gate electrode 418, formed over the blocking dielectric layer. The transistor 400 further includes heavily doped source and drain (S/D) regions 420 aligned to the gate stack 406 and separated by an undoped or lightly doped channel region 422 formed in or on the surface 410 of the substrate 404. Generally, one or more sidewall spacers 424 surround the gate stack 406 to electrically insulate it from contacts (not shown) to the S/D regions 420 and from other transistors or devices formed on the substrate 404.

It will be appreciated that the strain inducing layer 402, which substantially covers the completed transistor 400 and at least a portion of the surface 410 of the substrate 404, induces strain in the underlying channel region 422 as well as in the gate stack 406. As noted above, inducing strain in the channel region 422 improves transistor performance by reducing the band gap and increasing carrier mobility. In addition, it has been found inducing strain in the gate stack 406, and more specifically in the multi-layer charge-trapping region 414, will change energy levels of charge traps formed within the multi-layer charge-trapping region 414 improving data retention characteristics of the memory transistor 400.

The strain inducing layer 402 can include one or more layers of a suitable material including, for example, one or more layers of silicon-oxides, silicon-nitrides, and/or silicon-germanium, having thicknesses and deposited under conditions selected to induce a desired compressive or tensile strain in the region 422 and/or the gate stack 406.

Preferably, the strain inducing layer 402 includes a silicon-nitride (nitride) layer deposited to a thickness of from about 100 angstroms (Å) to about 1000 Å, and more preferably from about 300 Å to about 500 Å. For example, in one embodiment the strain inducing layer 402 can include a Plasma Enhanced Chemical Vapor Deposition (PECVD) silicon-nitride ($Si_3N_4$) layer deposited by a PCEVD process using a silicon source, such as silane, chlorosilane, or dichlorosilane, and a nitrogen source, such as nitrogen ($N_2$) or ammonia ($NH_3$). Suitable PECVD tools for carrying out this process include, for example, a Novellus PECVD tool, commercially available from Novellus Systems, Inc. of San Jose, Calif.

Alternatively, the strain inducing layer 402 can include a Bis-TertiaryButylAmino Silane (BTBAS) silicon-nitride layer ($Si_3N_4$) that is deposited using a BTBAS gas or precursor in a Low Pressure Chemical Vapor Deposition (LPCVD) or Atomic Layer Deposition (ALD) process to produce a longitudinal tensile strain and a vertically compressive strain in the channel region 422, both of which increase electron mobility in a NFET or N-type memory transistor.

As shown in FIG. 4A the multi-layer charge-trapping region 414 generally includes at least a substantially trap-free, first layer 414A disposed above and proximal to the tunnel dielectric layer 412, and a trap-dense second layer 414B disposed above and proximal to the first layer. It has been found that providing a substantially trap-free, first layer 414A in the multi-layer charge-trapping region 414 decreases the charge loss rate after programming and after erase, which is manifested in a small voltage shift in the retention mode, while providing a trap-dense second layer 414B improves the speed and increases of the initial difference between program and erase voltage without compromising a charge loss rate of the memory transistor 400, thereby extending the operating life of the device.

In some embodiments, the total thickness of multi-layer charge-trapping region 414 is in the range of 5-10 nanometers, and the thicknesses of the individual first and second layers 414A and 414B is approximately equal.

Substrate 404 and, hence, channel region 422, may be composed of any material suitable for semiconductor device fabrication. In one embodiment, substrate 404 is a bulk substrate composed of a material which may include, but is not limited to, silicon, germanium, silicon-germanium or a III-V compound semiconductor material. In another embodiment, substrate 404 includes a bulk layer with a top epitaxial layer composed of a material which may include, but is not limited to, silicon, germanium, silicon-germanium, a III-V compound semiconductor material and quartz in and on which the memory transistor 400 is fabricated. Substrate 404 and, hence, channel region 422, may include dopant impurity atoms. In a specific embodiment, the channel region 422 includes polycrystalline silicon or polysilicon and is doped P-type, or, in an alternative embodiment, doped N-type. In another specific embodiment, the channel region 422 includes recrystallized polysilicon and is doped either P-type or N-type.

Source and drain (S/D) regions 420 in substrate 404 generally include opposite conductivity to channel region 422.

For example, in one embodiment, the source and drain regions 420 are N-type doped regions while channel region 422 is a P-type doped region. In one version of this embodiment, the substrate 404 and, hence, channel region 422, is composed of boron-doped silicon having a boron concentration in the range of $1\times10^{15}$–$1\times10^{19}$ atoms/cm$^3$. Source and drain regions 420 are composed of phosphorous or arsenic doped regions having a concentration of N-type dopants in the range of $5\times10^{16}$–$5\times10^{19}$ atoms/cm$^3$. In a specific embodiment, source and drain regions 420 have a depth in substrate 404 in the range of 80-200 nanometers. In an alternative embodiment, source and drain regions 420 are P-type doped regions while channel region 422 is an N-type doped region.

The tunnel dielectric layer 412 may be any material and have any thickness suitable to allow charge carriers to tunnel into the multi-layer charge-trapping region 414 under an applied gate bias while maintaining a suitable barrier to leakage when the memory transistor 400 is unbiased. In one embodiment, tunnel dielectric layer 412 is formed by a thermal oxidation process and is composed of silicon dioxide or silicon oxy-nitride, or a combination thereof. In another embodiment, tunnel dielectric layer 412 is formed by chemical vapor deposition or atomic layer deposition and is composed of a dielectric layer which may include, but is not limited to, silicon nitride, hafnium oxide, zirconium oxide, hafnium silicate, hafnium oxy-nitride, hafnium zirconium oxide and lanthanum oxide. In a specific embodiment, tunnel dielectric layer 412 has a thickness in the range of 1-10 nanometers. In a particular embodiment, tunnel dielectric layer 412 has a thickness of approximately 2 nanometers.

The blocking dielectric layer 416 may be any material and have any thickness suitable to maintain a barrier to charge leakage without significantly decreasing the capacitance of gate stack 406. In one embodiment, the blocking dielectric layer 416 is formed by a chemical vapor deposition process and is composed of silicon dioxide, silicon oxynitride, silicon nitride, or a combination thereof. In another embodiment, the blocking dielectric layer 416 is formed by atomic layer deposition and is composed of a high-k dielectric layer which may include, but is not limited to, hafnium oxide, zirconium oxide, hafnium silicate, hafnium oxy-nitride, hafnium zirconium oxide and lanthanum oxide. In a specific embodiment, the blocking dielectric layer 416 has a thickness in the range of 1-20 nanometers.

Gate electrode 418 may be composed of any conductor or semiconductor material suitable for accommodating a bias during operation of a non-volatile memory transistor, including doped polysilicon and a metal-containing material. In a specific embodiment, the gate electrode 418 has a thickness in the range of 1-20 nanometers In one embodiment, the gate stack 406 includes an oxide-nitride-nitride-oxide (ONNO) stack formed by an oxide tunnel dielectric layer 412, first and second layers 414A and 414B of the multi-layer charge-trapping region 414 comprising a nitride or oxynitride, and an oxide blocking dielectric layer 416.

Optionally, in some versions of this embodiment the channel region 422 can include silicon or polysilicon, and the gate electrode 418 can include a doped polysilicon to provide a SONNOS stack or SONNOS-type non-volatile memory transistor.

In another embodiment, either or both the blocking dielectric layer 416 and trap-dense second layer 414B of the multi-layer charge-trapping region 414 can be made with or replaced by a high K dielectric layer. Suitable high K dielectrics materials include hafnium based materials such as HfSiON, HfSiO or HfO, Zirconium based material such as ZrSiON, ZrSiO or ZrO, and Yttrium based material such as $Y_2O_3$.

Figure 4B:
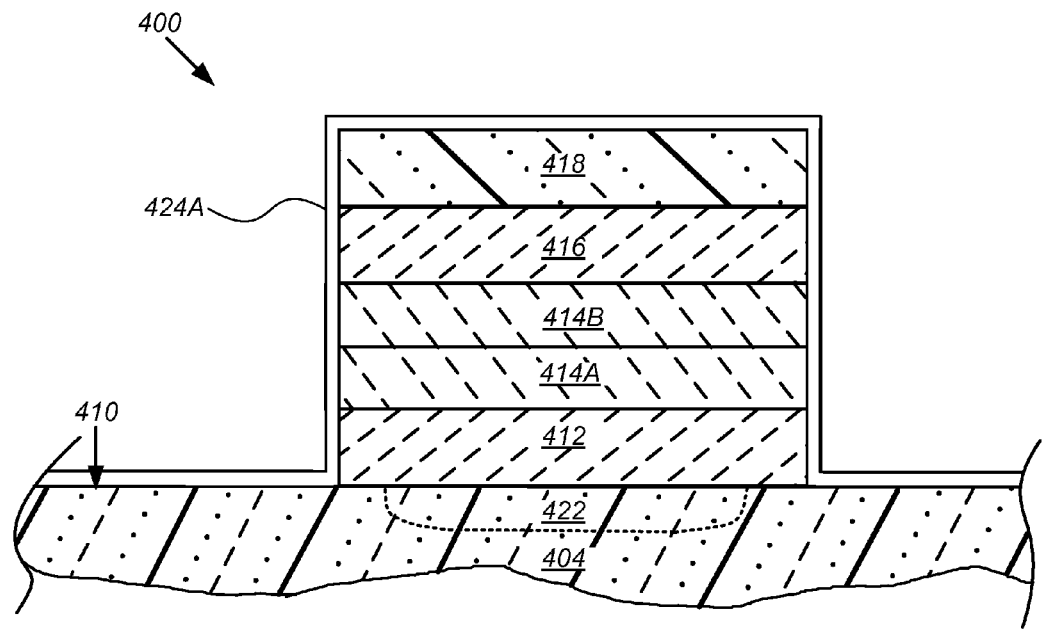
FIGS. 4B through 4D illustrate a process flow for forming a memory transistor including a gate stack with a multi-layer charge-trapping region and a strain inducing structure using composite spacers including a disposable material that is removed prior to forming the strain inducing layer according to an embodiment of the present invention.
Figure 4C:
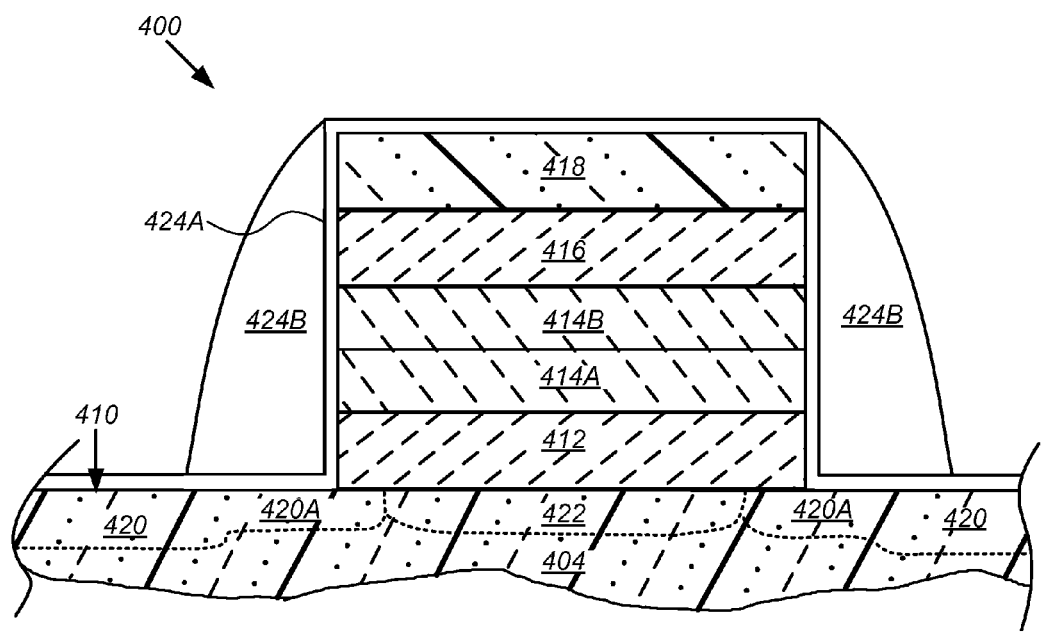
Figure 4D:
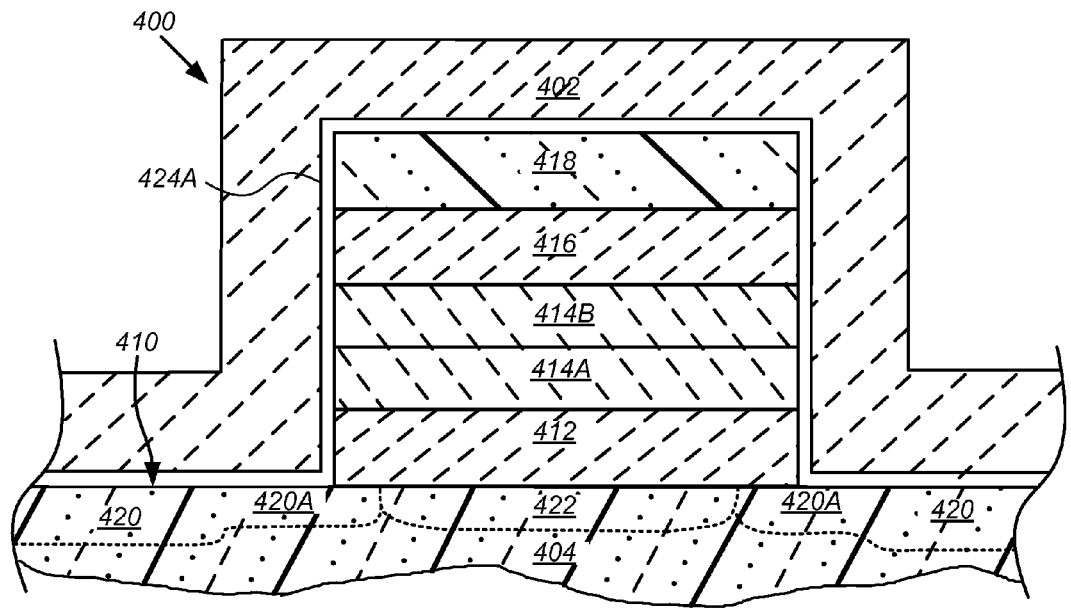

In another embodiment, illustrated in FIGS. 4B through 4D, the sidewall spacers for the memory transistor 400 can include composite spacers comprising a protective liner 424A and a sacrificial or disposable material 424B that is removed prior to forming the strain inducing layer 402. It will be appreciated that by eliminating the permanent sidewall spacers found in conventional transistors, the pitch or spacing between transistors or devices in the semiconductor memory or IC can be reduced. Moreover, eliminating the permanent spacers allows the strain inducing layer 402 to be located closer to the channel region 422 and the gate stack 406, thereby enabling it to produce a more focused strain of from about to about 400 MPa to about 600 MPa, or from about 0.15 to about 0.30% directly in the channel region and the gate stack 406. It has been found that this amount of strain is sufficient to yield from about a 4 to about a 40 percent increase in speed of the memory transistor 400.

A method of forming then removing the disposable material 424B of the composite spacers will now be described in greater detail with reference to FIGS. 4B through 4D. Referring to FIG. 4B, a protective liner 424A is formed over the gate stack 406 and, preferably, over at least a portion of the surface 410 of the substrate 404 prior to implanting the S/D regions (not shown in this figure). The protective liner 424A serves to protect the gate stack 406 and the adjacent surface 410 of the substrate 404 during subsequent forming and removal of the disposable spacers (not shown in this figure) and to electrically insulate it from contacts (not shown) to the S/D regions (not shown in this figure) and from other transistors or devices in the IC formed on the substrate 404. Generally, the protective liner 424A can include an oxide, such as silicon-oxide, or a nitride, such as silicon-nitride, and can be deposited by any suitable standard processing technique including, for example, CVD, or PECVD. Preferably, the protective liner 424A extends over regions in which the source and drain of the memory transistor are to be formed.

Optionally, tip and halo implants may be performed through the protective liner 424A to form S/D extensions 420A (shown in FIG. 4C) extending partially into the channel region 422 under the gate stack 406.

Referring to FIG. 4C, sacrificial spacers of a disposable material 424B are formed over the protective liner 424A and abutting sidewalls of the gate stack 406. The disposable material 424B can be formed by first depositing and then blanket etching a silicon-containing layer over the gate stack 406. The silicon-containing layer can include, for example, an amorphous-silicon or poly-silicon layer, or a silicon-germanium (SiGe) layer. The spacer or blanket etch may be accomplished in a number of different ways including, for example, low pressure etching at a moderate power (about 400 W) in a plasma of a chlorine containing gas, such as $Cl_2$, or $BCl_3$.

Next, still referring to FIG. 4C, the source and drain implants of the appropriate species and energy are implanted through the protective liner 424A and the disposable material 424B to form the S/D regions 420. Preferably, the substrate 404 is annealed to drive-in the source and drain implants creating the S/D regions 420 shown in FIG. 4C. More preferably, the anneal step, if not done immediately following the S/D implant, is at least performed prior to deposition of the strain inducing layer (described below) to avoid relaxing or reducing the strain induced by the strain inducing layer.

In FIG. 4D, the disposable material 424B is stripped or removed and the strain inducing layer 402 deposited. In one embodiment, amorphous-silicon or poly-silicon disposable material 424B is removed in a dry etch step using Xenon difluoride (XeF$_2$), preceded by a hydrofluoric (HF) dip to remove any native oxide thereon, which would otherwise impede removal of the spacers by the XeF$_2$. A suitable XeF$_2$ etch process involves sublimating the XeF$_2$ is in a container or vessel to a pressure of about 4 mTorr (the vapor pressure of XeF$_2$), and then introduced into a separate etch chamber in which the substrate 404 is positioned. Preferably, the XeF$_2$ release or etching process is performed in vapor phase at a pressure of 60 mTorr, at room temperature and with no external energy sources. Under these conditions, a highly selective and isotropic etch of the silicon-containing layer has been observed with rates as high as 10 microns per minute. The XeF$_2$ release process is allowed to proceed without etching any of the underlying protective liner 424A.

In an alternative embodiment, the disposable material 424B is removed in a wet etch step. For example, disposable material 424B including an amorphous or poly-silicon silicon-containing layer can be stripped or removed in a single wafer wet processing tool, commercially available from SEZ Group, of Villach, Austria, or in a wet processing bath or sink using a mixed nitric acid (HNO3) and HF wet chemistry. Disposable material 424B including a SiGe silicon-containing layer can be removed in a wet chemistry containing heated hydrogen peroxide (H$_2$O$_2$).

Still referring to FIG. 4D, the strain inducing layer 402 is deposited directly over the gate stack 406 and at least a portion of the surface 410 of the substrate 404 adjacent thereto to induce strain in the channel region 422 underlying the gate stack 406. As described above, the strain inducing layer 402 can include one or more layers of suitable material having thicknesses and deposited under conditions selected to induce a desired compressive or tensile strain in the channel region 422 and/or the gate stack 406. Preferably, the strain inducing layer 402 includes a compressive or tensile PECVD or BTBAS silicon-nitride layer.

Figure 4E:
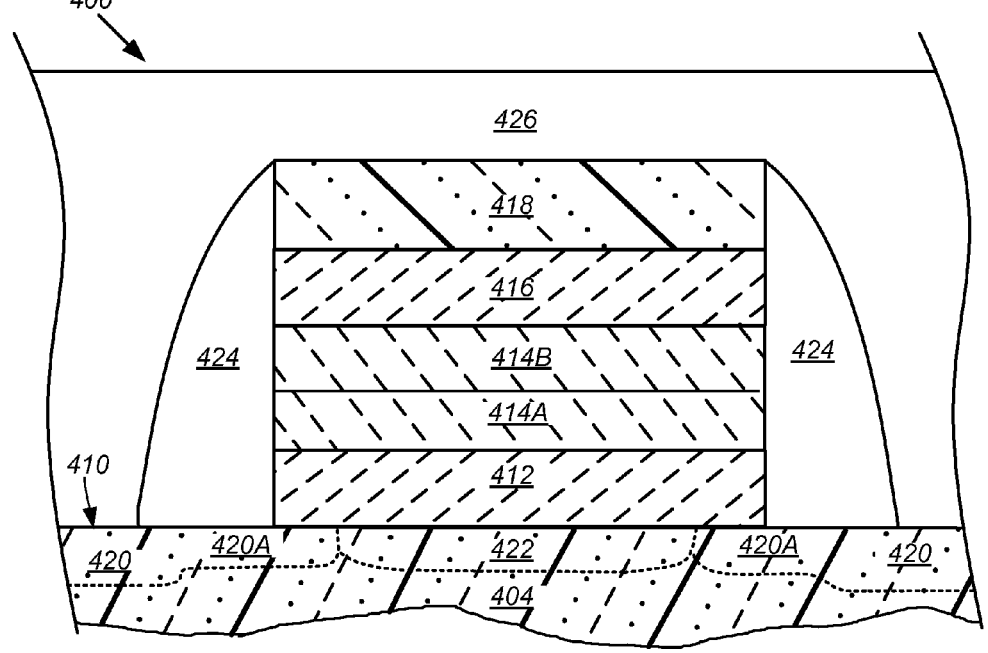
FIG. 4E is a partial cross-sectional side view of a memory transistor including a gate stack with a multi-layer charge-trapping region and a strain inducing pre-metal dielectric (PMD) layer according to an embodiment of the present invention.

In another embodiment, illustrated in FIG. 4E the strain inducing structure comprises a strain inducing pre-metal dielectric (PMD) layer 426 overlying the completed transistor previously formed on a substrate 404. As with the embodiments described above, the strain inducing PMD layer 426 can include one or more layers of a suitable dielectric material having thicknesses and deposited under conditions selected to induce a desired compressive or tensile strain in the channel region 422 and/or the gate stack 406. Suitable dielectric materials include, for example, silicon-oxides and silicon-nitrides.

In one embodiment, the strain inducing PMD layer 426 can include one or more layers of a tensile HARP™ oxide deposited in a HARP™ oxidation process using a LPCVD tool, ozone and/or TEOS based process gas or precursors. More preferably, the strain inducing PMD layer 426 has an overall or combined thickness of from about 400 Å to about 4000 Å. Generally, the surface of the PMD layer 426 is planararized using, for example, a CMP process prior to the formation of contacts (not shown) to the gate electrode 418 and S/D regions 420 of the transistor and the subsequent deposition of a local interconnect (LI) metal layer (not shown).

It is noted that each of the embodiments shown in FIGS. 4B through 4E can, like the embodiment of FIG. 4A, comprise a multi-layer charge-trapping region including at least a substantially trap-free, first layer 414A disposed above and proximal to the tunnel dielectric layer 412, and a trap-dense second layer 414B disposed above and proximal to the first layer.

It will be understood that in each of the embodiments shown in FIGS. 4B through 4E the gate stack 406 can, in certain embodiments include an oxide-nitride-nitride-oxide (ONNO) stack formed by an oxide tunnel dielectric layer 412, first and second layers 414A and 414B of the multi-layer charge-trapping region comprising a nitride or oxynitride, and an oxide blocking dielectric layer 416.

Optionally, in some versions of this embodiment the channel region 422 can include silicon or polysilicon, and the gate electrode 418 can include a doped polysilicon to provide a SONNOS stack or SONNOS-type non-volatile memory transistor.

It will further be understood that in each of the embodiments shown in FIGS. 4B through 4E, either or both the blocking dielectric layer 416 and trap-dense second layer 414B of the multi-layer charge-trapping region can be made with or replaced by a high K dielectric layer. Suitable high K dielectrics materials include hafnium based materials such as HfSiON, HfSiO or HfO, Zirconium based material such as ZrSiON, ZrSiO or ZrO, and Yttrium based material such as Y$_2$O$_3$.

Finally, it will be appreciated that although the strain inducing structures of the present invention are shown in FIGS. 4A through 4E and described above as being used with SONNOS memory transistors, the method and structures of the invention are not so limited and can be used with other types of FET memory or logic transistors. It is noted that a significant advantage of the present invention is that the processing method and strain inducing structures can be used to fabricate ICs including both memory and logic transistors on a single substrate, thereby improving the performance of both types of transistors. The method and structure of the present invention are particularly useful fabricating ICs including embedded memory such as System-On-Chip (SOC) ICs.

It will further be appreciated that one or more of the above described methods and structures can be combined to increase or tailor the strain induced in the channel region and/or gate stack 406 of the transistors. For example, the strain inducing STI structure 100 of FIG. 1 can be combined with any of the strain inducing structures described with respect to FIGS. 4A through 4E to increase or reduce the strain induced in the transistor channel region. In addition, it will be understood that the strain inducing PMD layer 426 of FIG. 4E may be combined with the composite spacers and disposable material 424B of FIGS. 4B through 4D to decrease the pitch or spacing between transistors and focus the strain more directly in the channel region and/or gate stack 406.

Figure 5:
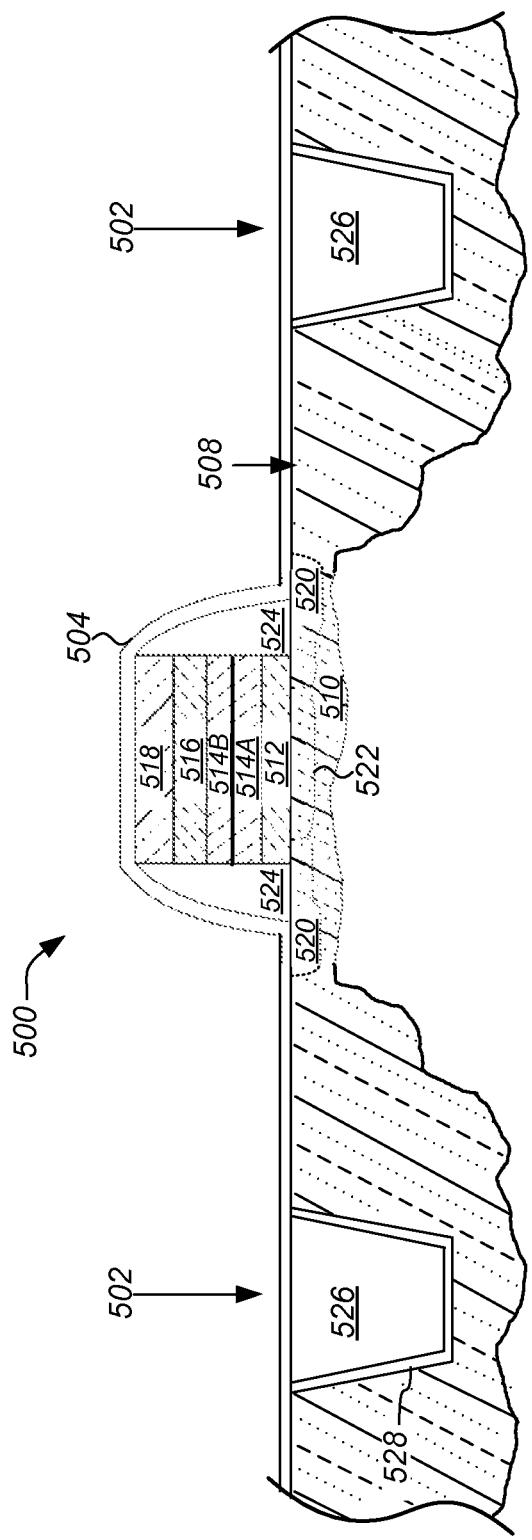
FIG. 5 is a partial cross-sectional side view of a portion of a substrate of including a memory transistor with a multi-layer charge-trapping region and a strain inducing shallow trench isolation according to an embodiment of the present invention.

In one embodiment, shown in FIG. 5, the, the memory transistor 500 combines strain inducing STI structures 502, similar to those shown in FIG. 1, with a strain inducing layer 504 similar to those shown in FIGS. 2A through 2E. Referring to FIG. 5, the memory transistor 500 further includes a gate stack formed over a surface 508 of a substrate 510. The gate stack generally includes a tunnel dielectric layer 512 disposed above the surface 508, a multi-layer charge-trapping region, disposed above the tunnel dielectric layer, a blocking dielectric layer 516 disposed above the multi-layer charge-trapping region, and a gate electrode 518, formed over the blocking dielectric layer. The transistor 500 further includes heavily doped source and drain (S/D) regions 520 aligned to the gate stack and separated by an undoped or lightly doped channel region 522 formed in or on the surface 508 of the substrate 510. Generally, one or more sidewall spacers 524 surround the gate stack to electrically insulate it from contacts (not shown) to the S/D regions 520 and from other transistors or devices formed on the substrate 510.

As shown in FIG. 5 the multi-layer charge-trapping region generally includes at least a substantially trap-free, first layer 514A disposed above and proximal to the tunnel dielectric layer 512, and a trap-dense second layer 514B disposed above and proximal to the first layer. It has been found that providing a substantially trap-free, first layer 514A in the multi-layer charge-trapping region decreases the charge loss rate after programming and after erase, which is manifested in a small voltage shift in the retention mode, while providing a trap-dense second layer 514B improves the speed and increases of the initial difference between program and erase voltage without compromising a charge loss rate of the memory transistor 500, thereby extending the operating life of the device.

The strain inducing STI structures 502 includes one or more relatively deep STI trenches filled with a dielectric material, such as an isolation oxide 526, having a high intrinsic tensile stress, and disposed about or encompassing the region in which the memory transistor 500 is to be formed. The STI structures 502 further include a liner oxide 528 formed on the surface 508 of the substrate 510 and on interior surfaces of the STI trench prior to filling with the isolation oxide 526.

The strain inducing layer 504, which substantially covers the completed transistor 500 and at least a portion of the surface 508 of the substrate 510, induces strain in the underlying channel region 522 as well as in the gate stack. As noted above, inducing strain in the channel region 522 improves transistor performance by reducing the band gap and increasing carrier mobility. In addition, it has been found inducing strain in the gate stack, and more specifically in the multi-layer charge-trapping region, will change energy levels of charge traps formed within the multi-layer charge-trapping region improving data retention characteristics of the memory transistor 500.

In another aspect the present disclosure is directed to multigate or multigate-surface memory transistors including a gate with a multi-layer charge-trapping region, and a strain inducing structure, such as a strain inducing layer disposed proximal to the gate stack to increase charge retention of the multi-layer charge-trapping region, and methods of fabricating the same. Multigate transistors include both planar and non-planar transistors. A planar multigate transistor (not shown) generally includes a double-gate planar transistor in which a number of first layers are deposited to form a first gate below a subsequently formed channel region, and a number of second layers are deposited thereover to form a second gate. A non-planar multigate transistor generally includes a horizontal or vertical channel region formed on or above a surface of a substrate and surrounded on three or more sides by a gate.

Figure 6A:
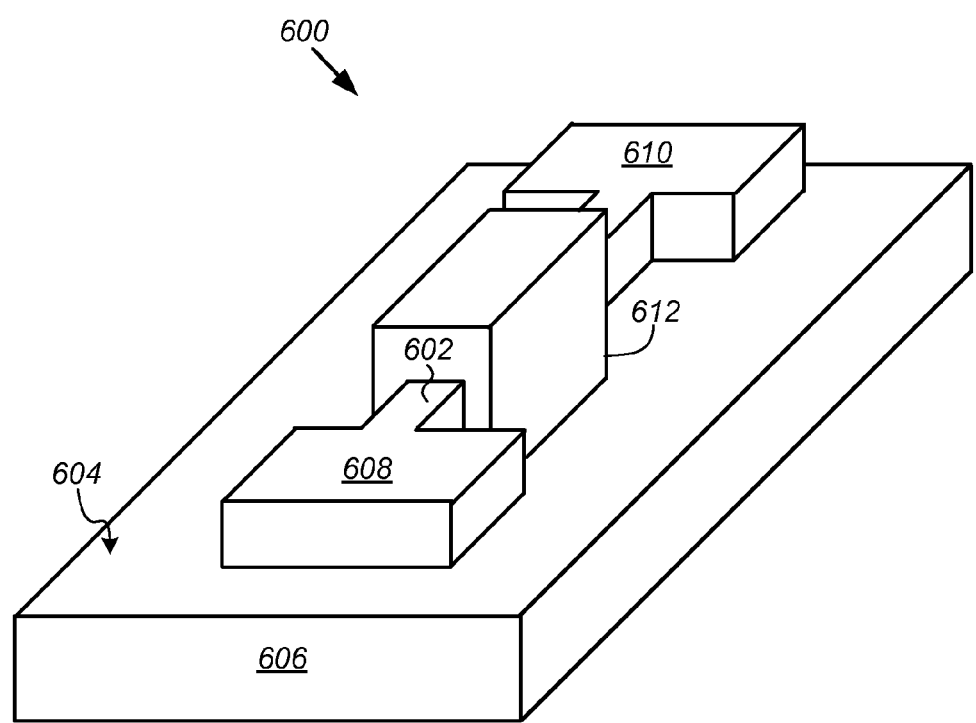
FIGS. 6A and 6B illustrate a non-planar finFET device including a multi-layer charge-trapping region and a strain inducing structure according to an embodiment of the present invention.

FIG. 6A illustrates one embodiment of a non-planar multigate memory transistor including a multi-layer charge-trapping region. Referring to FIG. 6A, the memory transistor 600, commonly referred to as a finFET, includes a channel region 602 formed from a thin film or layer of semiconducting material overlying a surface 604 on a substrate 606 connecting a source 608 and a drain 610 of the memory transistor. The channel region 602 is enclosed on three sides by a fin which forms a gate 612 of the transistor. The thickness of the gate 612 (measured in the direction from source to drain) determines the effective channel region length of the transistor.

Figure 6B:
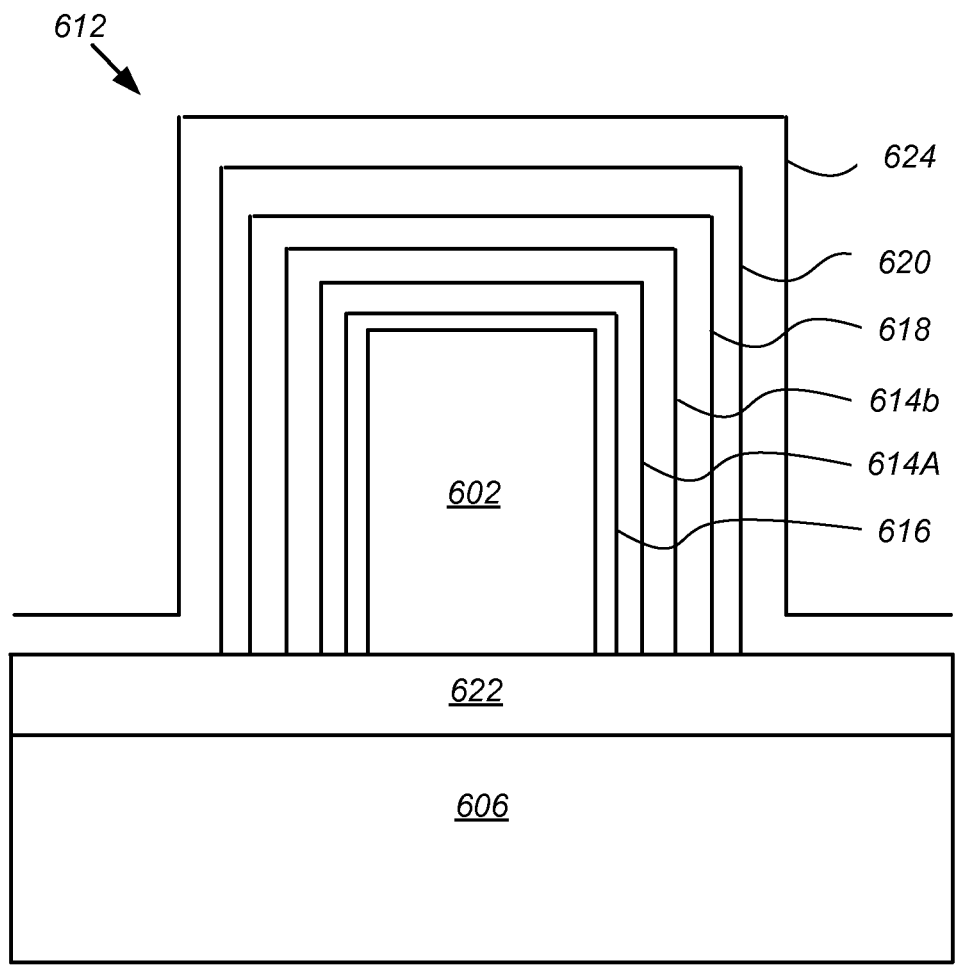

In accordance with the present disclosure, the non-planar multigate memory transistor 600 of FIG. 6A can include a strain inducing structure, such as a strain inducing layer (not shown in this figure) to increase retention in the multi-layer charge-trapping region. FIG. 6B is a cross-sectional view of a portion of the non-planar memory transistor of FIG. 6A including a portion of the substrate 606, channel region 602 and the gate 612 illustrating a multi-layer charge storing layer 614A, 614B. The gate 612 further includes a tunnel dielectric layer 616 overlying a raised channel region 602, a blocking dielectric layer 618 and a metal or doped polysilicon layer overlying the blocking dielectric layer to form a gate electrode 620 of the memory transistor 600. The channel region 602 and gate 612 can be formed directly on substrate 606 or on an insulating or dielectric layer 622, such as a buried oxide layer, formed on or over the substrate.

Referring to FIG. 6B, the multi-layer charge-trapping region includes at least a substantially trap-free, first layer 614A closer to the tunnel dielectric layer 616, and a trap-dense second layer 614B overlying the first layer. Generally, the second layer 614B includes a majority of a charge traps distributed in the multi-layer charge-trapping region, while the first layer 614A includes an oxygen-rich nitride or silicon oxynitride, to reduce the number of charge traps therein. By oxygen-rich it is meant wherein a concentration of oxygen in the first layer 614A is from about 15 to about 40%, whereas a concentration of oxygen in second layer 614B is less than about 5%.

In one embodiment, the blocking dielectric layer 618 also includes an oxide, such as an HTO, to provide an ONNO structure. The channel region 602 and the overlying ONNO structure can be formed directly on a silicon substrate 606 and overlaid with a doped polysilicon gate electrode 620 to provide a SONNOS structure.

As with the embodiments described above, either or both of the first layer 614A and the second layer 614B can include silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The second nitride layer of the multi-layer charge storing structure is then formed on the middle oxide layer. The second layer 614B has a stoichiometric composition of oxygen, nitrogen and/or silicon different from that of the first layer 614A, and may also be formed or deposited by a CVD process using a process gas including $DCS/NH_3$ and $N_2O/NH_3$ gas mixtures in ratios and at flow rates tailored to provide a silicon-rich, oxygen-lean top nitride layer.

Finally, in those embodiments including a blocking dielectric layer 618 including oxide the oxide may be formed or deposited by any suitable means. In one embodiment the oxide of the blocking dielectric layer 618 is a high temperature oxide deposited in a HTO CVD process. Alternatively, the blocking dielectric layer 618 or blocking oxide layer may be thermally grown, however it will be appreciated that in this embodiment the top nitride thickness may be adjusted or increased as some of the top nitride will be effectively consumed or oxidized during the process of thermally growing the blocking oxide layer. A third option is to oxidize the top nitride layer to a chosen depth using radical oxidation.

A suitable thickness for the first layer 614A may be from about 30 Å to about 60 Å (with some variance permitted, for example ±10 Å. A suitable thickness for the second layer 614B may be at least 30 Å. In certain embodiments, the second layer 614B may be formed up to 130 Å thick, of which 30-70 Å may be consumed by radical oxidation to form the blocking dielectric layer 618. A ratio of thicknesses between the first layer 614A and second layer 614B is approximately 1:1 in some embodiments, although other ratios are also possible.

In other embodiments, either or both of the second layer 614B and the blocking dielectric layer 618 may include a high K dielectric. Suitable high K dielectrics include hafnium based materials such as HfSiON, HfSiO or HfO, Zirconium based material such as ZrSiON, ZrSiO or ZrO, and Yttrium based material such as $Y_2O_3$.

The memory transistor 600 further includes a strain inducing structure, such as a strain inducing layer 624 disposed proximal to the gate 612 to increase charge retention of the multi-layer charge-trapping region, and of the channel region 602 to increase which and increasing carrier mobility.

The strain inducing layer 624, which substantially covers the completed transistor 600 and at least a portion of the surface 508 of the substrate 510, induces strain in the underlying channel region 602 as well as in the gate 612. As noted above, inducing strain in the channel region 602 improves transistor performance by reducing the band gap and increasing carrier mobility. In addition, it has been found inducing strain in the gate 612, and more specifically in the multi-layer charge-trapping region, will change energy levels of charge traps formed within the multi-layer charge-trapping region improving data retention characteristics of the memory transistor 600.

As with the embodiments described above, the strain inducing layer 624 can comprise any suitable dielectric materials and may be deposited by any suitable means, depending on the material of the strain inducing layer, and is deposited under conditions selected to induce a desired compressive or tensile strain in the gate stack.

Suitable dielectric materials include, for example, silicon-oxides and silicon-nitrides, deposited in a HARP™ oxidation process or a LPCVD process.

A method or forming or fabricating a memory transistor including a multi-layer charge-trapping region and a strain inducing structure according to one embodiment is now described with reference to the flowchart of FIG. 7.

Figure 7:
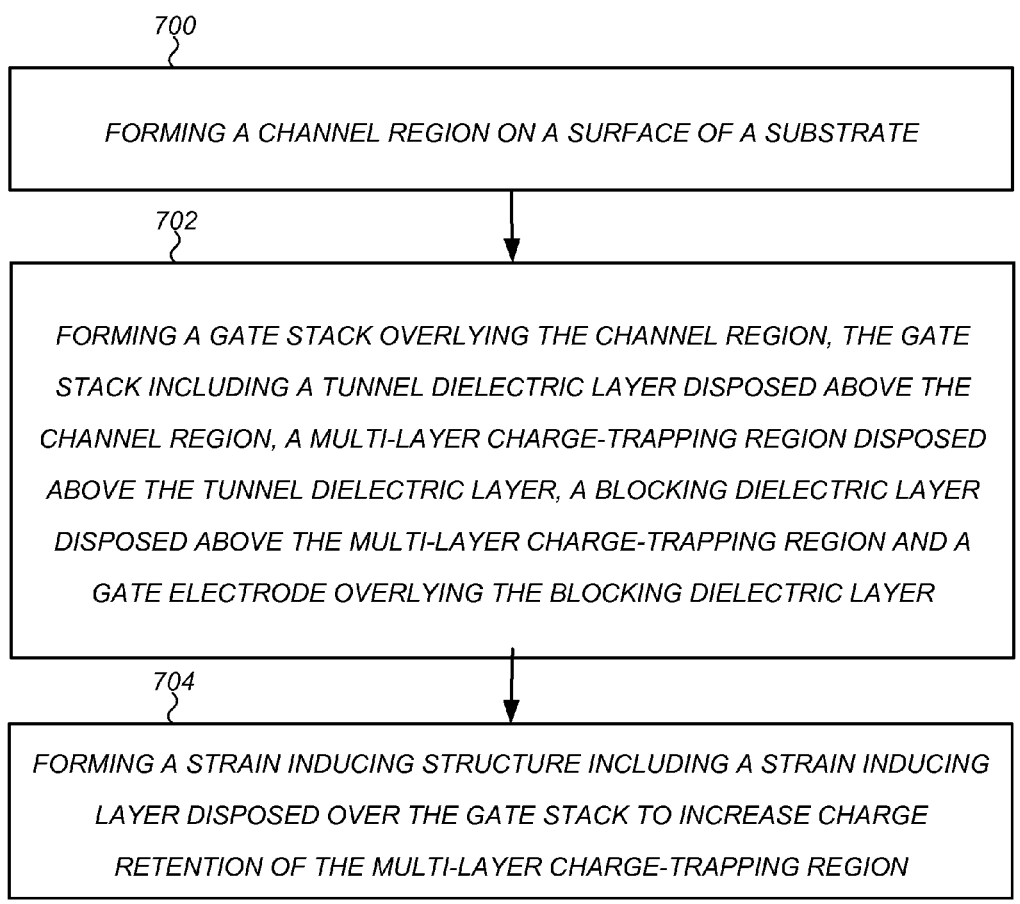
FIG. 7 is a flowchart illustrating a method for fabricating a memory transistor including a multi-layer charge-trapping region and a strain inducing structure according to an embodiment of the present invention.

Referring to FIG. 7, the method begins with forming a channel region on a surface of a substrate (700). Next, a gate stack is formed overlying the channel region, the gate stack including a tunnel dielectric layer disposed above the channel region, a multi-layer charge-trapping region disposed above the tunnel dielectric layer, a blocking dielectric layer disposed above the multi-layer charge-trapping region and A blocking dielectric layer disposed above the multi-layer charge-trapping region and a gate electrode overlying the blocking dielectric layer (702).

As noted above, the multi-layer charge-trapping region includes at least a substantially trap-free first layer comprising an oxygen-rich nitride and a trap-dense second layer disposed above the first layer. In one embodiment, the first layer can be formed or deposited by a CVD process using a process gas comprising a dichlorosilane ($SiH_2Cl_2$)/ammonia ($NH_3$) mixture at a ratio in the range of about 5:1 to 15:1; and a nitrous oxide ($N_2O$)/$NH_3$ mixture at a ratio in the range of about 2:1 to 4:1 and at flow rates tailored to provide a silicon-rich and oxygen-rich oxynitride layer which is substantially trap free. That is the stoichiometric composition of the first layer comprises a high concentration of oxygen selected to increase retention performance of the multi-layer charge-trapping region by acting as a barrier between charge trapped in the second layer and the substrate. The selected concentration of oxygen in the first layer 220B can include an oxygen concentration of from about 15% to about 40%, and, in certain embodiments about 35%.

The trap-dense second layer is then formed on a surface of the first layer. The second layer has a stoichiometric composition of oxygen, nitrogen and/or silicon different from that of the first layer. In particular, and as noted above, the second layer can be formed or deposited by a CVD process using a process gas using a process gas comprising a $N_2O/NH_3$ mixture at a ratio in the range of about 1:6 to 1:8 and a $SiH_2Cl_2/NH_3$ mixture at a ratio in the range of about 1.5:1 to 3:1 to provide a trap dense nitride layer having an oxygen concentration of about 5% or less. Thus, the second layer comprises a charge trap density at least 1000 times greater than the first layer.

Next, the blocking dielectric layer is formed or deposited over the second layer of the multi-layer charge-trapping region by any suitable means. In one embodiment blocking dielectric layer is formed a manner that results in thinning of the second layer of the multi-layer charge-trapping region to a predetermined thickness through oxidization of a portion of the second layer.

Alternatively, as noted above either or both the blocking dielectric layer and the trap-dense second layer of the multi-layer charge-trapping region can be made with or replaced by a high K dielectric layer. Suitable high K dielectrics materials include hafnium based materials such as HfSiON, HfSiO or HfO, Zirconium based material such as ZrSiON, ZrSiO or ZrO, and Yttrium based material such as $Y_2O_3$.

The gate electrode is formed or deposited over the blocking dielectric layer to complete formation of the gate stack. The gate electrode can include, for example, a polysilicon layer deposited by a CVD process, or a metal containing layer deposited by any suitable physical vapor deposition process, such as sputtering, evaporative deposition or electron beam physical vapor deposition.

Finally, a strain inducing structure, such as a strain inducing layer or PMD, is formed or deposited over the gate stack to increase charge retention of the multi-layer charge-trapping region (704). As noted above, the strain inducing layer can be deposited by any suitable means, depending on the material of the strain inducing layer, and is deposited under conditions selected to induce a desired compressive or tensile strain in the gate stack. Suitable dielectric materials include, for example, silicon-oxides and silicon-nitrides, deposited in a HARP™ oxidation process or a LPCVD process.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A semiconductor device comprising:
  a memory transistor including an oxide-nitride-nitride-oxide (ONNO) stack disposed above a channel region, the ONNO stack comprising a tunnel dielectric layer disposed above the channel region, a multi-layer charge-trapping region disposed above the tunnel dielectric layer, the multi-layer charge-trapping region including a substantially trap-free layer comprising an oxygen-rich nitride and a trap-dense layer disposed above the trap-free layer, and a blocking dielectric layer disposed above the multi-layer charge-trapping region; and
  a strain inducing structure including a strain inducing layer disposed proximal to the ONNO stack to increase charge retention of the multi-layer charge-trapping region.

2. The semiconductor device of claim 1, wherein the blocking dielectric layer comprises a high K dielectric.

3. The semiconductor device of claim 1, wherein the trap-dense layer comprises a high K dielectric.

4. The semiconductor device of claim 1, wherein the strain inducing structure comprises a number of trenches filled with an oxide having intrinsic tensile stress in a surface of a substrate proximal to the channel region to induce strain therein.

5. The semiconductor device of claim 1, wherein the channel region projects above a surface of the substrate on which the memory transistor is formed, and further comprising a fin intersecting and overlying at least a portion of the channel, the fin comprising the ONNO stack.

6. The semiconductor device of claim 5, wherein the blocking dielectric layer comprises a high K dielectric.

7. The semiconductor device of claim 5, wherein the trap-dense layer comprises a high K dielectric.

8. The semiconductor device of claim 1, wherein the strain inducing layer comprises a pre-metal dielectric (PMD) layer formed using a High Aspect Ratio Process (HARP™) oxidation process.

9. The semiconductor device of claim 1, wherein the strain inducing layer comprises a compressive nitride layer formed using a plasma enhanced chemical vapor deposition (PECVD) process.

10. The semiconductor device of claim 1, wherein the strain inducing layer comprises a tensile nitride layer formed using a plasma enhanced chemical vapor deposition.

11. The semiconductor device of claim 1, wherein the strain inducing layer comprises a Bis-TertiaryButylAmino Silane (BTBAS) nitride layer that is deposited using a BTBAS gas.

12. The semiconductor device of claim 1, further including a logic transistor, and wherein the strain inducing structure is further formed proximal to the logic transistor to induce strain in a channel region thereof.

13. A semiconductor device comprising:
a memory transistor including an oxide-nitride-nitride-oxide (ONNO) stack on a surface of a substrate overlying a channel region formed therein, the ONNO stack comprising a tunnel dielectric layer disposed above the channel region, a multi-layer charge-trapping region disposed above the tunnel dielectric layer, the multi-layer charge-trapping region including a substantially trap-free layer comprising an oxygen-rich nitride and a trap-dense layer disposed above the trap-free layer, and a blocking dielectric layer disposed above the multi-layer charge-trapping region;
a strain inducing structure including a strain inducing layer disposed proximal to the ONNO stack to increase charge retention of the multi-layer charge-trapping region, and overlying at least a portion of the surface of the substrate surrounding the channel region to induce strain in the channel region.

14. The semiconductor device of claim 13, wherein the blocking dielectric layer comprises a high K dielectric.

15. The semiconductor device of claim 13, wherein the trap-dense layer comprises a high K dielectric.

16. The semiconductor device of claim 13, wherein the strain inducing structure comprises a number of trenches filled with an oxide having intrinsic tensile stress in a surface of a substrate proximal to the channel region to induce strain therein.

17. A method of forming a semiconductor device comprising:
forming an oxide-nitride-nitride-oxide (ONNO) stack for a memory transistor on a surface of a substrate overlying a channel region formed therein, the ONNO stack including a tunnel dielectric layer disposed above the channel region, a multi-layer charge-trapping region disposed above the tunnel dielectric layer, the multi-layer charge-trapping region including a substantially trap-free layer comprising an oxygen-rich nitride and a trap-dense layer disposed above the trap-free layer, and a blocking dielectric layer disposed above the multi-layer charge-trapping region; and
forming a strain inducing structure including a strain inducing layer disposed over the ONNO stack to increase charge retention of the multi-layer charge-trapping region.

18. The method of claim 17, wherein forming the ONNO stack includes forming a blocking dielectric layer comprising a high K dielectric.

19. The method of claim 17, wherein forming the ONNO stack includes forming a trap-dense layer comprises a high K dielectric.

20. The method of claim 17, wherein the channel region projects above the surface of the substrate, and wherein forming the ONNO stack comprises forming a fin intersecting and overlying at least a portion of the channel, the fin including the ONNO stack.

* * * * *